(12) United States Patent
Tur et al.

(10) Patent No.: US 7,339,108 B2
(45) Date of Patent: Mar. 4, 2008

(54) SOLAR ENERGY CONCENTRATOR DEVICE FOR SPACECRAFT AND A SOLAR GENERATOR PANEL

(75) Inventors: Myriam Tur, Mandelieu la Napoule (FR); Thierry Dargent, Auribeau sur Siagne (FR); Sylvie Brosse, Les Adrets de l'Esterel (FR)

(73) Assignee: Thales, Neuilly sur Seine (FR)

( * ) Notice: Subject to any disclaimer, the term of this patent is extended or adjusted under 35 U.S.C. 154(b) by 731 days.

(21) Appl. No.: 10/336,819

(22) Filed: Jan. 6, 2003

(65) Prior Publication Data

US 2003/0155003 A1 Aug. 21, 2003

(30) Foreign Application Priority Data

Jan. 7, 2002 (FR) .................................. 02 00127

(51) Int. Cl.
*H01L 31/052* (2006.01)
*B64G 1/44* (2006.01)
*F24J 2/18* (2006.01)

(52) U.S. Cl. ...................... 136/246; 136/259; 136/256; 136/244; 136/292; 136/245; 136/248; 257/436; 60/641.8; 244/172.8

(58) Field of Classification Search .............. 136/246, 136/259, 256, 244, 292, 245, 248; 257/436; 60/641.8; 244/172.8
See application file for complete search history.

(56) References Cited

U.S. PATENT DOCUMENTS 3,232,795 A * 2/1966 Gillette et al. .............. 136/246
5,219,020 A * 6/1993 Akachi .................. 165/104.26
5,660,644 A * 8/1997 Clemens ..................... 136/245
6,091,017 A * 7/2000 Stern .......................... 135/246
6,111,190 A 8/2000 O'Neill
6,118,067 A * 9/2000 Lashley et al. ............. 136/245
6,177,627 B1 * 1/2001 Murphy et al. ............ 136/246
6,188,012 B1 * 2/2001 Ralph ......................... 136/246
6,528,716 B2 * 3/2003 Collette et al. ............. 136/246
2004/0187906 A1 * 9/2004 Boulanger et al. ......... 136/244

FOREIGN PATENT DOCUMENTS

EP 1174342 A1 1/2002
WO WO 00/79593 A1 * 12/2000

OTHER PUBLICATIONS

K. D. Bunte et al, Structural and Operational Aspects of the Concentrating Sara-Louver Solar Generator, European Space Power. Madrid, Oct. 2-6, 1989, Proceedings of the European Space Power Conference, Noordwijk, ESA Publications, NL, vol. 2, pp. 549-556, XP000173829.

* cited by examiner

*Primary Examiner*—Arun S. Phasge
(74) *Attorney, Agent, or Firm*—Sughrue Mion, PLLC

(57) ABSTRACT

A device is disclosed for reducing the risk of primary and secondary electrostatic discharges occurring in particular in the solar generators of spacecraft. A solar energy concentrator device for spacecraft includes a reflector for reflecting solar radiation onto a photovoltaic cell for converting solar energy into electrical energy and a heat transfer arrangement for transporting to a cold area heat energy stored by the cell following reception of solar radiation. One particular application of the device is to solar panels for satellites.

20 Claims, 6 Drawing Sheets

Prior Art FIG_1a   FIG_1b Prior Art

FIG_1c Prior Art

Prior Art FIG_1d

FIG_1e Prior Art

FIG_2a

FIG_3

FIG_4

FIG_5

FIG_2b

FIG_6

FIG_7a

FIG_7b

FIG_7c

FIG_7d

FIG_7e

Evolution of concentration factor

FIG_8

SOLAR ENERGY CONCENTRATOR DEVICE FOR SPACECRAFT AND A SOLAR GENERATOR PANEL

CROSS-REFERENCE TO RELATED APPLICATIONS

This application is based on French Patent Application No. 02 00 127 filed Jan. 7, 2002, the disclosure of which is hereby incorporated by reference thereto in its entirety, and the priority of which is hereby claimed under 35 U.S.C. §119.

BACKGROUND OF THE INVENTION

1. Field of the Invention

The present invention relates generally to arrays of solar energy concentrators, in particular for space applications. It relates more particularly to an energy concentrator device employing solar cells.

2. Description of the Prior Art

The solar generator panels carried on a spacecraft such as a geosynchronous satellite generally comprise:

panels supporting an array of identical or different photovoltaic cells for converting solar energy into electrical energy, and an array of identical or different solar cells forming strings of cells that are electrically connected and cover the surface of the support panel.

Solar generator panels of the above kind can be deployed in highly diverse configurations. Conventionally this means in a longitudinal succession parallel to a direction away from the body of the spacecraft and about which the generator turns to track the sun. However, to increase the electrical power available, it has been proposed to provide supplementary lateral panels in addition to the panels previously described. Also known in the art are configurations in which the panels are disposed in a transverse direction, i.e. in a direction transverse to the longitudinal direction previously cited along which extends the yoke that connects the generator to the body of the spacecraft and about which the generator turns to track the sun.

Energy concentrator arrays of the type mentioned hereinabove are described in the documents U.S. Pat. No. 6,188,012 and WO 00/79593 A1, for example.

However, anomalies corresponding to loss of sections of solar panels have been observed with this type of array.

Analysis of the space environment and tests on the ground have shown that the space environment can generate electrostatic charging and discharging phenomena in the panels. Further analyses and tests have shown that an electrostatic discharge between a solar cell of a panel and its cover glass can cause a short circuit between the cell and an adjacent cell, leading to a flow of solar generator output current between the cells. The energy conveyed by this current is then sufficient to destroy the insulative substrate of the cell support (which is generally made of Kapton™) and render it conductive.

Figure 1A:
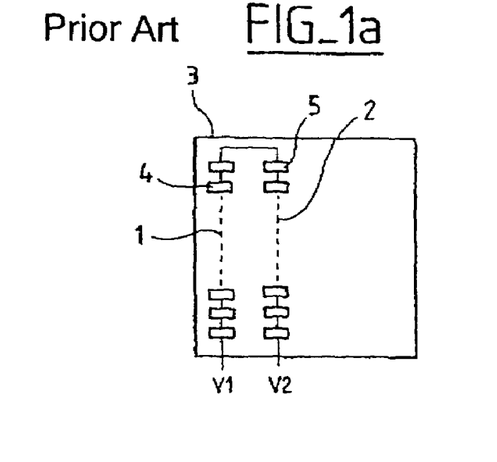
FIGS. 1a to 1e, already described, show two rows of prior art solar cells and more particularly how they can deteriorate following primary and secondary discharges.

To be more precise, the scenario leading to the anomalies observed proceeds in the following stages (see FIGS. 1a to 1e):

FIG. 1a shows two rows 1, 2 of cells of a solar generator panel 3. Each row includes a predetermined number of solar cells 4, 5 and the respective voltages at the terminals of each row are V1 and V2 volts.

Figure 1B:
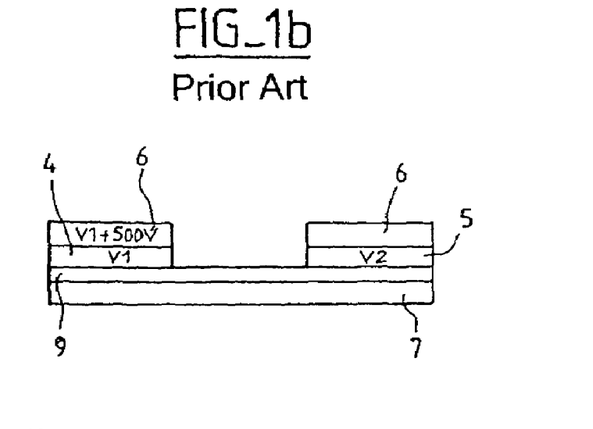

Referring to FIG. 1b, because of the space environment, an inverted voltage gradient (IVG) appears between the solar cell connected to the electrical ground of the satellite (for example the cell 4) and its cover glass 6. Because of photo-emission, the cover glass is less negatively charged than the frame 7 (the rear face of the panel, and therefore in the shade), to which the cell is connected.

Figure 1C:
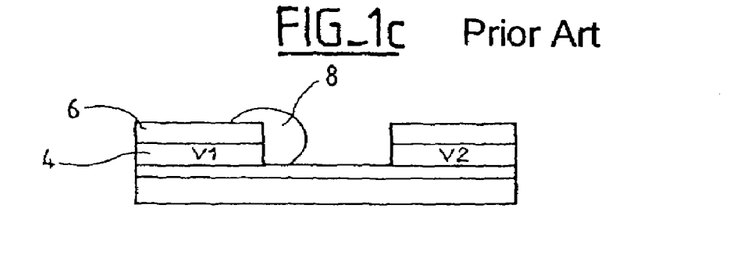

If the voltage between the solar cell 4 and the cover glass 6 exceeds a particular threshold, a primary electrostatic discharge occurs and generates a dense plasma 8, as shown in FIG. 1c. This discharge contains little energy and is in itself not a risk to the operation of the solar generator. The plasma created in this way propagates in the gap between adjacent cells.

Figure 1D:
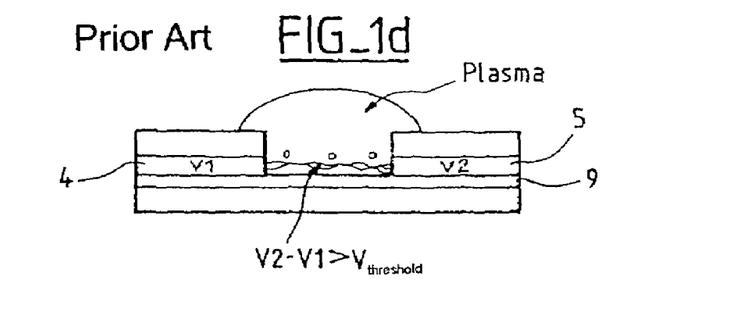

However, if the voltage between these cells is higher than a threshold $V_{threshold}$, the output current of the row can then flow between the cells via the plasma. This secondary arc can be maintained by the output current of the generator for a few seconds or more, as shown in FIG. 1d.

Figure 1E:
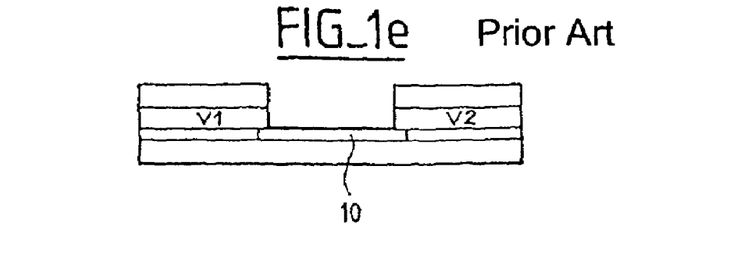

It appears that the secondary arc then dissipates sufficient energy to heat the insulative substrate 9 to a temperature such that the high resistance polymer is converted into a material of very low resistance. This process (known as pyrolysis) makes the part 10 shown shaded in the figure completely conductive, which leads to a permanent short circuit between the two cells 4 and 5, and therefore between the two rows of cells 1 and 2, as shown in FIG. 1e, and also between the cell (4 or 5) and the electrical ground of the satellite, which causes the permanent destruction of a portion of the solar generator, so that it is incapable of delivering all of the output power to the equipment of the satellite.

One method of reducing the primary discharge risk consists of adding electrically conductive surfaces to the illuminated face of the solar generator and connecting them to the electrical ground of the satellite. Moreover, a method of reducing the risk of secondary discharge between adjacent rows would be to increase the gap between rows of photovoltaic cells. However, the space created in this way would reduce the ratio by which the panel is filled with cells and would then compromise the solar energy collecting power of the panel.

An object of the present invention is to remedy the above problems by proposing an energy concentrator device for spacecraft that employs solar cells and is of the type described above, and which reduces the risk of primary and secondary electrostatic discharge.

SUMMARY OF THE INVENTION

To this end, the invention provides a solar energy concentrator device for spacecraft, including a reflector for reflecting solar radiation onto a photovoltaic cell for converting solar energy into electrical energy and heat transfer means adapted to transport to a cold area heat energy stored by the cell following reception of solar radiation.

In one embodiment of the invention, the heat transfer means connect a first panel in contact with the cell to the cold area.

In one embodiment of the invention, the heat transfer means include a capillary heat transfer system.

In one embodiment of the invention, the heat transfer means include a heat micropipe containing a heat-exchange material.

In one embodiment of the invention, the heat transfer means include a thermally conductive dielectric for reducing the thermal gradient in the device.

In one embodiment of the invention, the reflector has an electrically conductive external wall adapted to offer the property of optical absorptivity in the range of infrared frequencies in order to absorb in the form of infrared radiation heat stored following the reception of solar radiation and further adapted to offer the property of reflection in the range of visible light frequencies. The internal wall has heat emitting properties to evacuate heat to the vacuum of space.

In one embodiment of the invention, the device also includes electrically conductive means connecting the external wall of the reflector and the electrical ground of the panel (which is generally the electrical structure of the spacecraft).

In one embodiment of the invention, the heat transfer means are integrated into a support panel of the cell.

In one embodiment of the invention, the external wall of the reflector is covered with a coating adapted to reflect visible light, for example by depositing an aluminum film, and its internal wall is covered with a high-emissivity coating, for example black paint.

In one embodiment of the invention, the base of the reflector made from an electrically conductive material and having a high reflectivity in the visible spectrum is situated at a minimum electrostatic discharge triggering distance from the ends of the solar cell.

In one embodiment of the invention, the aforementioned distance is 0.8 mm.

The invention also provides a solar generator panel including a solar energy concentrator device according to the invention.

In one embodiment of the invention, the panel includes a plurality of reflectors for reflecting solar radiation onto a corresponding plurality of strings of cells, the reflectors and the strings of cells are arranged alternately, and each string of cells is aligned with the width or the length of the panel.

Other features and advantages of the invention will become more clearly apparent on reading the following description of particular embodiments given with reference to the accompanying drawings.

DETAILED DESCRIPTION OF THE PREFERRED EMBODIMENTS

Components with exactly the same function are identified by the same reference numbers in all the figures.

Figure 2A:
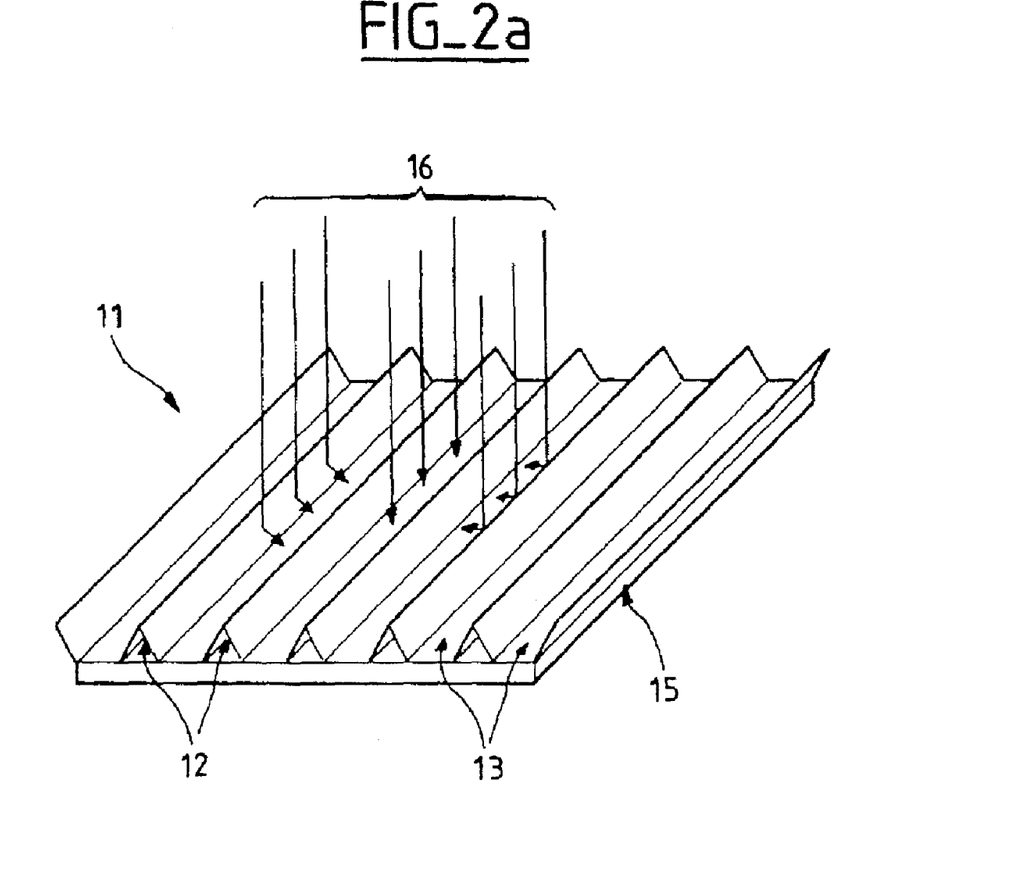
FIG. 2a is a diagrammatic perspective view of a solar generator panel portion.

FIG. 2a is a diagrammatic perspective view of a solar generator panel 11.

The panel 11 has, on its face intended to be oriented toward the light source, an alternating succession of reflectors 12 and strings 13 of solar cells 14. Note that in this embodiment the reflectors have a sawtooth configuration. Any other reflector shape can of course be envisaged, whether of the parabolic or other type. The reflectors and the cells are supported by a support panel 15.

Figure 2B:
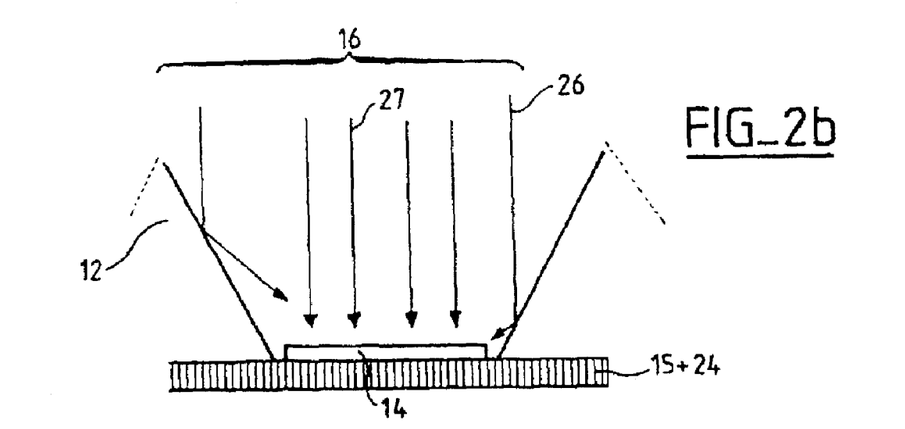
FIG. 2b shows the path of direct light rays and light rays reflected by the reflector impinging on the solar generator.

FIGS. 2a and 2b show, in the form of a plurality of arrows, a solar flux 16, some beams 27 of which illuminate the cell 14 directly, while other beams 26 impinge on the cell after reflection at a reflector.

Figure 6:
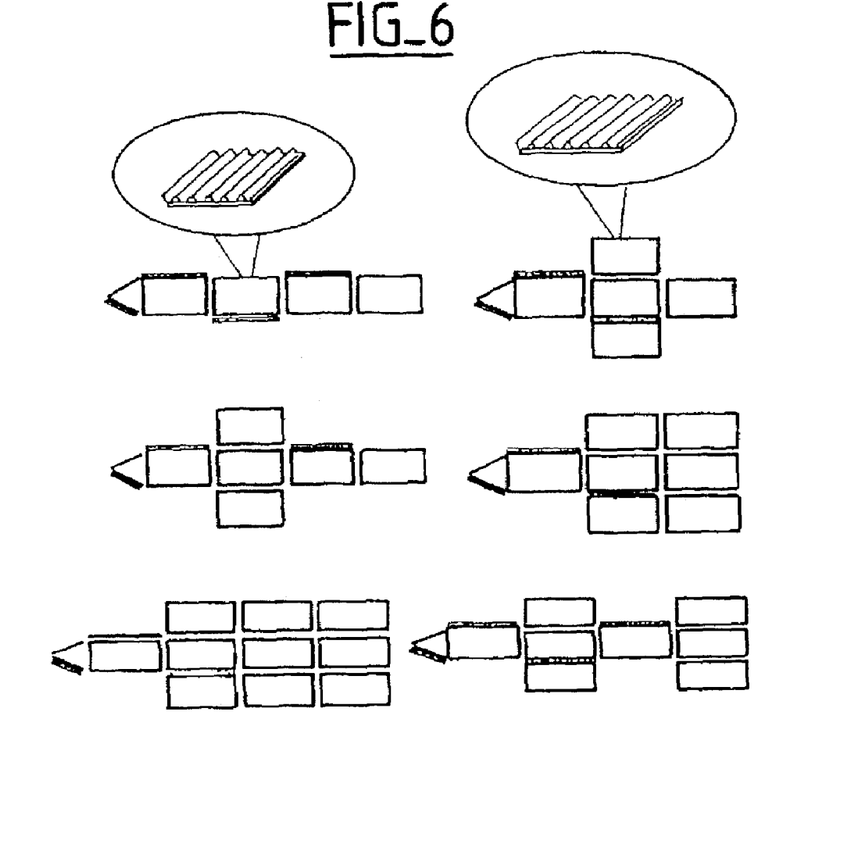
FIG. 6 shows embodiments of integrated central and lateral panels including concentrator panels according to the invention.

Note further in FIGS. 2a and 6 (described below) that the cells and reflectors are arranged across the width of the panels, to minimize any penalty in respect of the power balance should an antenna or other appendage shade the panel. The cells and reflectors can of course equally well be arranged along the length of the panels that support them.

Figure 3:
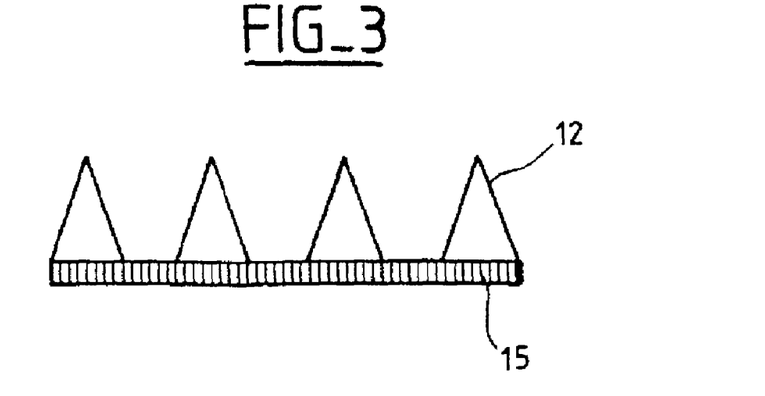
FIG. 3 is a diagrammatic partial view in cross section of the panel from FIG. 2.

FIG. 3 shows the panel from FIG. 2a in cross section. The advantage of this kind of configuration is that it reduces the effects of distortion of the reflectors on the power supplied by the solar panel, because here the concentration is localized, rather than spread over a complete panel. This is reflected in an improved concentration factor.

In the case of the present invention, the concentration factor $C_{geometric}$ is a function of the angle of inclination $\theta$ of the reflectors to the plane of the support panel, as defined by the following equation:

$$C_{geometric}=1+2\sin(2\theta-90°)$$

The theoretical limit for this factor is $C_{geometric}=3$.

Figure 7A:
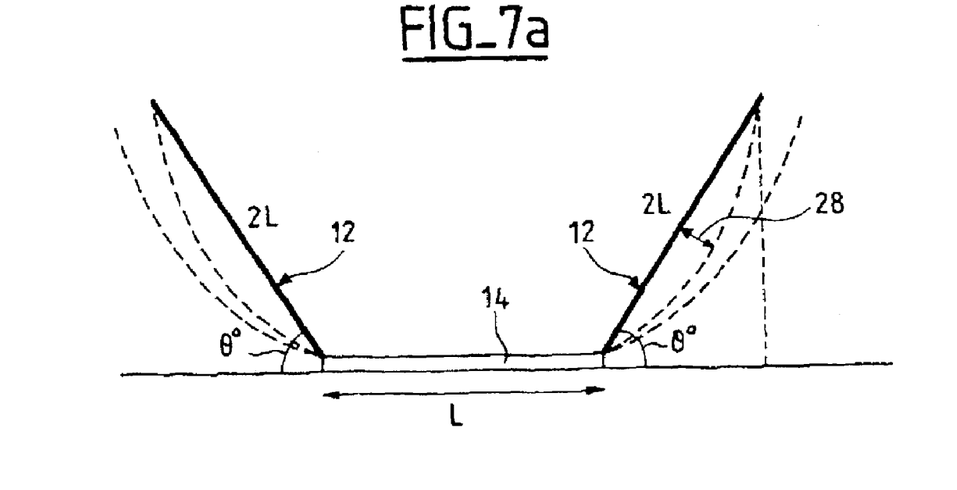
FIG. 7a shows reflector walls facing a solar cell and having a concavity represented by a double-headed arrow.
Figure 7B:
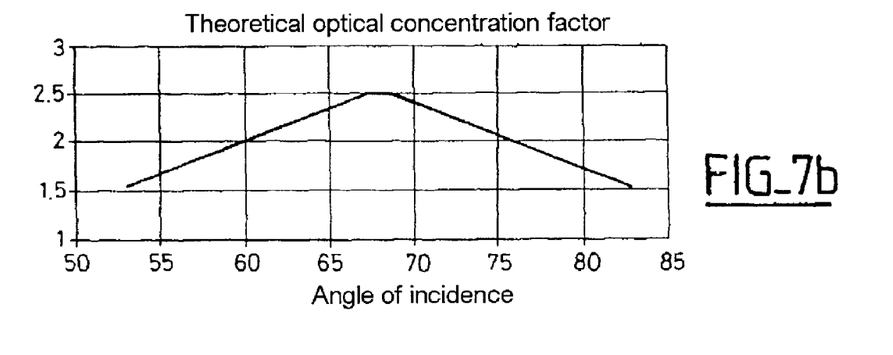
FIG. 7b shows the evolution of the concentration factor as a function of the angle of incidence for a given configuration.
Figure 7C:
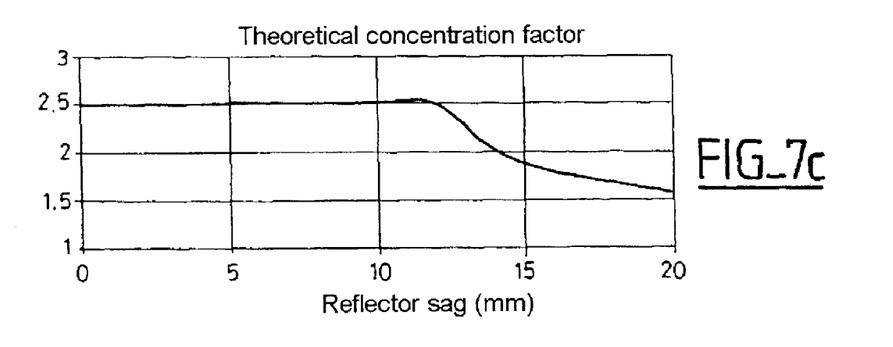
FIG. 7c shows the impact of the concavity of the reflectors on the optical concentration factor $C_{optic}$.

In the practical situation where the reflectors have a length 2L and L is the dimension on the cell 14, as shown in FIG. 7a, the theoretical optical factor obtained by the ray-tracing method reaches an optimum value equal to 2.5 for an angle of incidence corresponding to $\theta=68°$, as can be seen in FIG. 7b, which shows the theoretical optical concentration factor as a function of the angle of incidence $\theta$. This presupposes that the reflectivity of the reflectors is R=1 and that the reflectors are perfectly flat. FIG. 7c represents the effect of imposing on a reflector wall a curvature or concavity indicated by a double-headed arrow 28 (FIG. 7a). The length of the arrow corresponds to what is known as the sag, i.e. the distance between the plane position of the reflector and its curved position. A double-headed arrow longer than 10 mm contributes to a sharp reduction of the optical concentration factor.

Figure 7D:
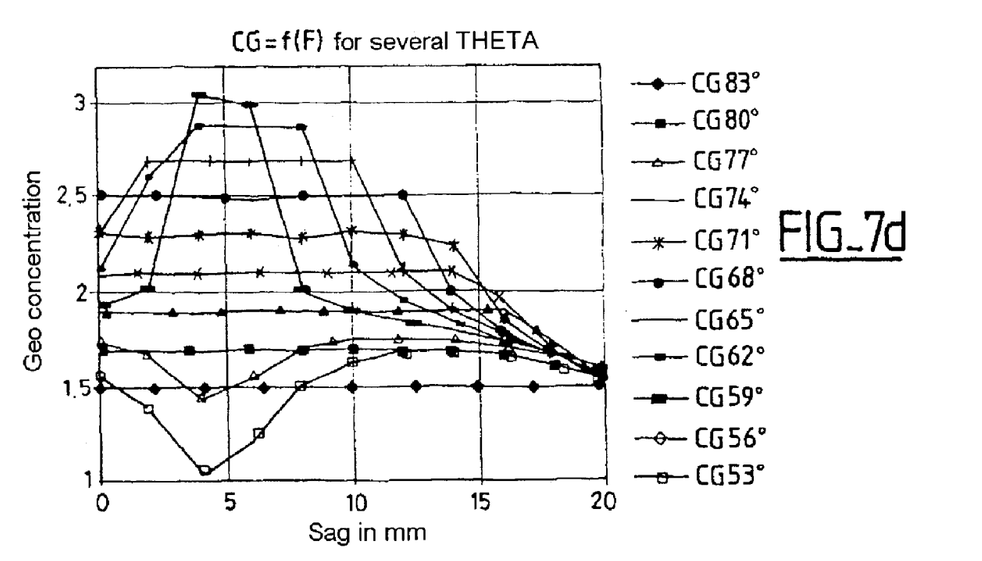
FIG. 7d shows the combined effect of the concavity and the angle of incidence of the reflectors on the optical concentration factor $C_{optic}$.

Any concavity of the reflectors varies their angles of incidence. FIG. 7d shows, in the original practical situation with $C_{optic}=2.5$, the variation of the concentration factor for different arrow lengths and consequently different angles of incidence. It can be seen that the optimum value is obtained for arrows approximately 4 mm long ($C_{optic}>3$ and therefore higher than the original concentration factor of 2.5). In fact, if the inclination of the reflectors decreases, the surface area of the reflectors seen by the sun increases and the potential energy received increases. In the case of plane reflectors, this energy is not returned to the cell, but if the reflector is curved the energy can be returned to the cell and thus increase the concentration factor.

Figure 7E:
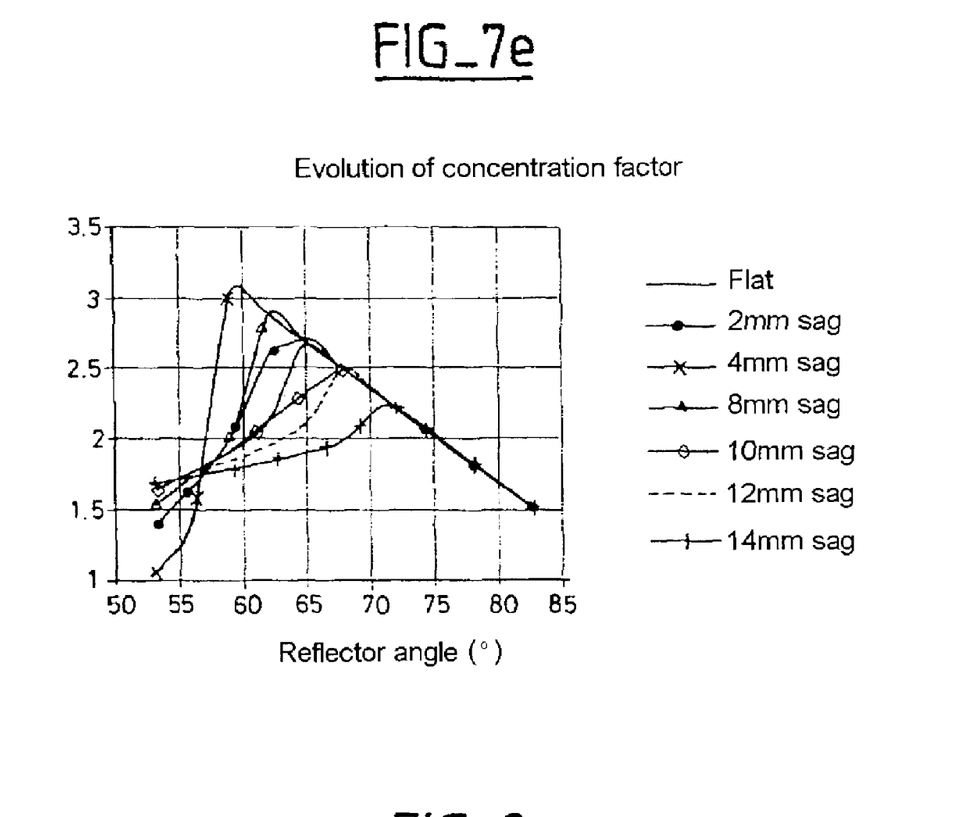
FIG. 7e shows the sensitivity of the optical concentration factor $C_{optic}$ as a function of the angle of incidence which is in turn linked to the concavity.

For a 4 mm arrow, $C_{optic}$ can become greater than the original $C_{optic}$, but becomes highly sensitive to the angle of incidence θ, as shown in FIG. 7e.

The optical concentration factor depends on the optical yield R of the reflective material, as follows: $C_{optic}=1+R$ ($C_{optic\ R=1}-1$). For example, for R=1, $C_{optic}=2.5$ and for R=0.88, $C_{optic}=2.32$.

To obtain an optical concentration factor stable to within 10%, an angle of incidence stability of ±4° and an arrow length of less than 12 mm are typically required.

Figure 4:
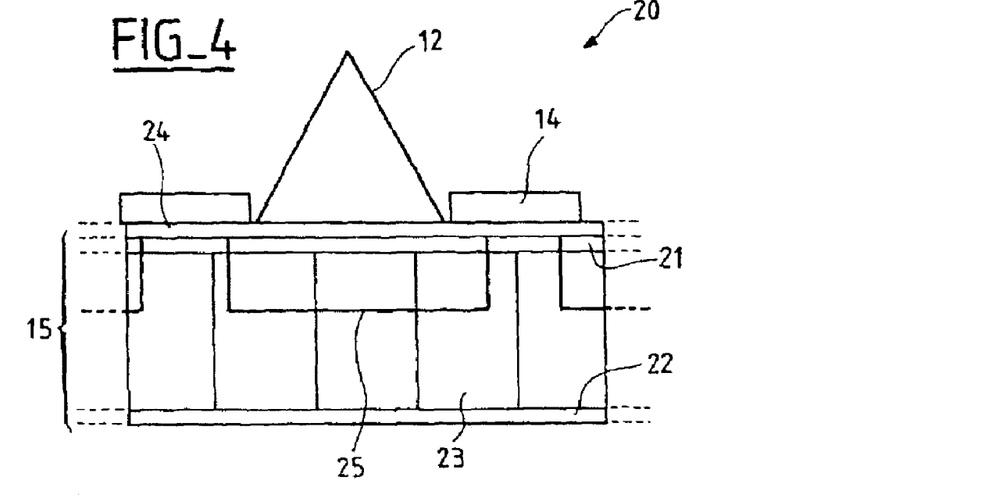
FIG. 4 is a partial view in cross section of a panel provided with a solar energy concentrator device conforming to one embodiment of the invention.
Figure 5:
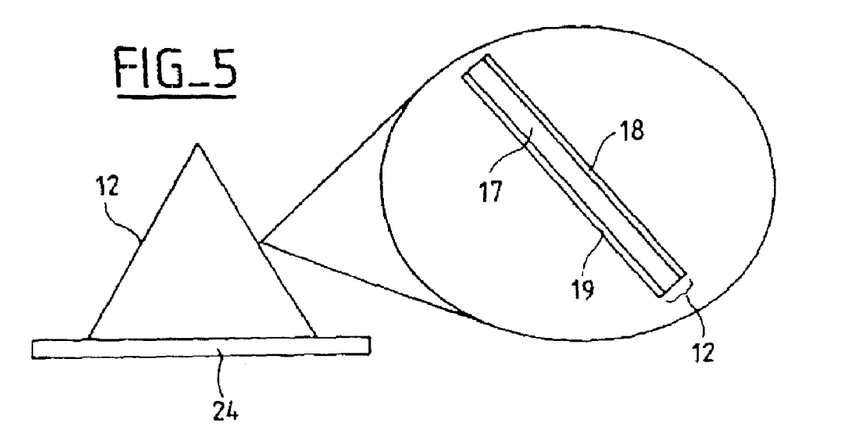
FIG. 5 shows a reflector.

FIG. 4 shows in section the panel 11 fitted with a solar energy concentrator device 20 conforming to one embodiment of the invention. This view shows a reflector 12, which is shown in more detail in two different views in FIG. 5 and has received an appropriate surface treatment on its internal and external walls. The reflector consists of a film 17 a few tens of micrometers thick of Kapton™ or Upilex™ or any other material having very good mechanical and thermal properties in order to withstand the thermal and mechanical demands of the space environment (entering/leaving eclipses, solar pressure, atomic oxygen, UV, etc.). The film 17 is covered with an electrochemically deposited optically reflecting film 18, for example a film of aluminum (or any other optically deposited material that is highly reflective in the visible spectrum and electrically conductive). The film 18 is adapted to offer an absorbent property in the range of infrared frequencies, in order to absorb in the form of infrared radiation the heat stored after receiving solar radiation, and is also adapted to offer an optical reflection property in the range of visible light frequencies. The internal wall 19 is therefore intended to evacuate heat by emitting it into space. It can be a deposit of black paint. These two surface treatments are applied to the thin film support 17. In this embodiment, a deposit of aluminum on the external wall of the reflector produces an infrared emissivity of 0.3. The internal face of the reflector is covered with a black paint that is highly emissive in the infrared band. These provisions are judiciously applied since in space, because of the microgravity, there can be no convection and the temperature of the solar generator panel is controlled exclusively by conductive and radiative exchanges with the environment.

Figure 8:
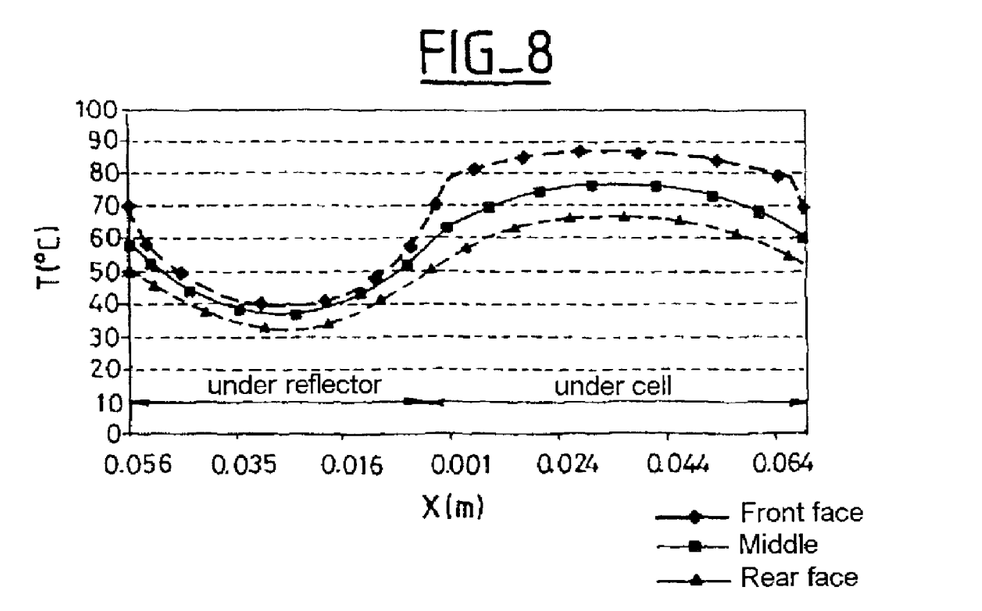
FIG. 8 shows the temperature under the solar cell and under the reflectors, thereby demonstrating the existence of a thermal gradient in the structure of the solar panel.

In FIG. 4, the support panel 15 of the cells and reflectors includes two identical carbon fiber plates 21 and 22 sandwiching a cellular (honeycomb) aluminum structure 23. The plate 21 is covered with d film 24 of dielectric (Kapton®, Upilex®, or any other electrically insulative material having high thermal conductivity), thereby preventing short circuiting of the solar cells. The honeycomb structure 23 with the plates 21 and 22 has exceptional mechanical properties and good transverse thermal conductivity (inherent to the aluminum honeycomb configuration). To increase the effectiveness of heat transfer in the longitudinal plane of the panel (i.e. in the plane of the panel 15) and consequently to reduce the thermal gradient inherent to the concept (high temperatures under the cells and low temperatures under the reflectors, see FIG. 8), heat micropipes 25 conveying a heat-exchange material, such as ammonia or water, connect a first cell 14 of a first string 13 to a facing second cell 14 belonging to an adjacent string 13. In this way, heat coming from hot areas corresponding to areas carrying cells is transmitted by the heat micropipes 25, complementing the dielectric and thermally conductive film (Kapton, Upilex, etc.) situated directly under the solar cells. The heat micropipes convey the heat energy to a thermal mass consisting of the cold areas of the panel 15, namely the areas under the reflectors 12, and the heat dissipation plate 22 to which heat is conveyed transversely by means of the conductive aluminum cells.

The use of heat micropipes complements the use of the film 24, which homogenizes the temperature between the hot areas under the cells and the cold areas under the reflectors. Because of the solar concentration and thus because of the concentration of IR rays reflected by the reflectors 12 and absorbed by the cells, this three-fold arrangement (heat micropipes, thermal film, honeycomb cellular structure) minimizes the thermal gradient in the support structure 15. Thus the invention reduces the risk of electrostatic discharges by using reflectors 12 coated with a film 18 that is not only optically reflective but also and more importantly electrically conductive.

Aluminum being electrically conductive, and the reflectors being placed on the illuminated face of the solar panel, photo-emission reduces the quantity of charge stored in the structure (the electrical ground of the satellite). The structure is therefore at a less negative potential. The risk of primary electrostatic discharge is reduced. For this, it is indispensable for the reflector coating to be conductive and to be electrically connected to the ground of the satellite (the conductive parts of the structure).

An equal advantage of the invention is that the plasma generated by the primary discharge cannot propagate between adjacent cells, because the reflectors provide screens. Moreover, this increases the distance between the emission site and the adjacent solar cell during a secondary discharge. The distance between solar cells (of the order of 0.8 mm) is reduced to the distance between the reflector (the emission site in this case) and the adjacent cell; this distance can be a few millimeters. The threshold voltage between cells above which a secondary arc is struck is increased, which reduces the risk of secondary arcing. In fact, for these reflectors, using an electrically conductive coating electrically connected to the electrical ground of the panel reduces the risk of primary electrostatic discharge and the risk of secondary arcing.

Of course, the invention is not limited to the embodiments described in this application.

The invention claimed is:

1. A solar energy concentrator device for spacecraft, including a first photovoltaic cell for converting solar energy into electrical energy and a second photovoltaic cell for converting solar energy into electrical energy and that is spaced from the first photovoltaic cell, a reflector for reflecting solar radiation onto at least one of the first photovoltaic cell and the second photovoltaic cell and located between the first photovoltaic cell and the second photovoltaic cell, and heat transfer means for transporting to a cold area heat energy stored by at least one of the first photovoltaic cell and the second photovoltaic cell following reception of solar radiation.

2. The device claimed in claim 1 wherein said heat transfer means include a capillary heat transfer system.

3. The device claimed in claim 1 wherein said heat transfer means include longitudinal means connecting a base of the first photovoltaic cell to a base of the second photovoltaic cell.

4. The device claimed in claim 3 wherein said capillary heat transfer system is formed of heat micropipes.

5. The device claimed in claim 1 wherein said heat transfer means include a heat micropipe containing a heat-exchange material.

6. The device claimed in claim 1 wherein said heat transfer means include a thermally conductive dielectric for reducing a thermal gradient in the device.

7. The device claimed in claim 1 wherein said reflector has an electrically conductive external wall adapted to offer the property of optical absorptivity in the range of infrared frequencies in order to absorb in the form of infrared radiation heat stored following the reception of solar radiation and further adapted to offer the property of reflection of solar radiation in the range of visible light frequencies, and a deposit resulting from a surface treatment adapted to increase the efficiency of heat radiation into space.

8. The device claimed in claim 1 wherein said external wall of the reflector is electrically connected to an electrical ground of a support panel.

9. The device claimed in claim 8 wherein said heat transfer means is integrated into a support panel of the first photovoltaic cell and the second photovoltaic cell.

10. The device claimed in claim 1 wherein a base of said reflector is made from an electrically conductive material having a high reflectivity in the visible spectrum and is situated at a minimum electrical discharge triggering distance from the ends of the at least one of the first photovoltaic cell and the second photovoltaic cell.

11. The device claimed in claim 10 wherein said distance is 0.8 mm.

12. A solar generator panel including a solar energy concentrator device as claimed in claim 1.

13. The panel claimed in claim 12 wherein said device includes a plurality of reflectors for reflecting solar radiation onto a corresponding plurality of strings of photovoltaic cells, said reflectors and said strings of photovoltaic cells are arranged alternately, and each string of photovoltaic cells is aligned with the width or the length of the panel.

14. A solar energy concentrator device for spacecraft, comprising:
a first photovoltaic cell for converting solar energy into electrical energy;
a second photovoltaic cell for converting solar energy into electrical energy and that is spaced from the first photovoltaic cell;
a reflector for reflecting solar radiation onto at least one of the first photovoltaic cell and the second photovoltaic cell and located between the first photovoltaic cell and the second photovoltaic cell;
a support panel by which the first photovoltaic cell, the second photovoltaic cell, and the reflector are supported; and
a capillary heat pipe located in the support panel that carries heat from the first photovoltaic cell and the second photovoltaic cell to a location in the panel under the reflector.

15. The solar energy concentrator according to claim 14, wherein the support panel has a honeycomb structure.

16. The solar energy concentrator according to claim 14, wherein the capillary heat pipe contains a heat exchange fluid.

17. The solar energy concentrator according to claim 16, wherein the heat exchange fluid is ammonia or water.

18. The solar energy concentrator according to claim 14, wherein the reflector has a face exposed away from the support panel that absorbs heat in the infrared band and that is optically reflective to reflect light in the visible band and a face exposed toward the support panel that is highly emissive in the infrared band; and wherein the reflector is electrically grounded to the support panel.

19. The solar energy concentrator according to claim 14, wherein the capillary heat pipe thermally coupling the first photovoltaic cell to the second photovoltaic cell.

20. The solar energy concentrator according to claim 14, further comprising:
a first string of photovoltaic cells that includes the first photovoltaic cell and a second string of photovoltaic cells that includes the second photovoltaic cell; and
a plurality of capillary heat pipes located in the support panel, each heat pipe thermally coupling a photovoltaic cell in the first string to an adjacent photovoltaic cell in the second string; and
wherein the reflector extends between first string and the second string and reflects solar radiation onto at least one of the first string and the second string.

* * * * *